United States Patent
Noguchi et al.

(10) Patent No.: US 7,560,317 B2
(45) Date of Patent: Jul. 14, 2009

(54) METHOD OF FORMING SINGLE CRYSTALLINE SILICON LAYER, STRUCTURE INCLUDING THE SAME, AND METHOD OF FABRICATING THIN FILM TRANSISTOR USING THE SAME

(75) Inventors: Takashi Noguchi, Yongin-si (KR); Wenxu Xianyu, Suwon-si (KR); Xiaoxin Zhang, Yongin-si (KR); Hans S. Cho, Seoul (KR); Kyung-bae Park, Seoul (KR)

(73) Assignee: Samsung Electronics Co., Ltd., KRX ( * ) Notice: Subject to any disclaimer, the term of this patent is extended or adjusted under 35 U.S.C. 154(b) by 333 days.

(21) Appl. No.: 11/493,182

(22) Filed: Jul. 26, 2006

(65) Prior Publication Data

US 2007/0048912 A1     Mar. 1, 2007

(30) Foreign Application Priority Data

Aug. 26, 2005    (KR)    ...... 10-2005-0078882

(51) Int. Cl.
*H01L 21/00*    (2006.01)
*H01L 21/84*    (2006.01)
(52) U.S. Cl. ........... 438/150; 438/155; 257/E21.414; 257/E21.423
(58) Field of Classification Search ............ 438/149, 438/158, 150, 151, 155; 257/E21.414, E21.423, 257/E21.679, E21.703
See application file for complete search history.

(56) References Cited

U.S. PATENT DOCUMENTS

| | | | |
|---|---|---|---|
| 660,652 A * | 10/1900 | Kim et al. | 213/193 |
| 6,395,586 B1 * | 5/2002 | Huang et al. | 438/149 |
| 6,518,103 B1 * | 2/2003 | Lai | 438/150 |
| 2004/0245587 A1 * | 12/2004 | Tada et al. | 257/414 |
| 2005/0173763 A1 * | 8/2005 | Takeguchi et al. | 257/347 |
| 2005/0250308 A1 * | 11/2005 | Yamaguchi et al. | 438/618 |
| 2006/0011972 A1 * | 1/2006 | Graham et al. | 257/324 |
| 2006/0166492 A1 * | 7/2006 | Orlowski et al. | 438/637 |
| 2006/0246709 A1 * | 11/2006 | Kim et al. | 438/618 |
| 2006/0270215 A1 * | 11/2006 | Lee et al. | 438/637 |

OTHER PUBLICATIONS

"Formation of Location-Controlled Crystalline Islands Using Substsrate-Embedded Seeds in Excimer-Laser Crystallization of Silicon Films"; Authors: Paul Ch. van der Wilt, B.D. van Dijk, G. J. Bertens, R. Ishihara, and C. I. M. Beenakker; Applied Physica Letters; vol. 79, No. 12; Date: Sep. 17, 2001.

* cited by examiner

Primary Examiner—Walter L Lindsay, Jr.
(74) Attorney, Agent, or Firm—Cantor Colburn LLP

(57) ABSTRACT

Provided are a method of forming a single crystalline silicon layer, a structure including the same, and method of fabricating a thin film transistor ("TFT") using the same. The method of forming the single crystalline silicon layer includes forming a silicon nitride layer on a substrate, forming an insulating layer on the silicon nitride layer, forming a hole in the insulating layer to a predetermined dimension, depositing a first silicon layer on an exposed bottom of the hole using a selective deposition process, depositing a second silicon layer on the insulating layer and the first silicon layer formed in the hole, and crystallizing the second silicon layer using a thermal process. In this method, a high-quality single crystalline silicon layer can be obtained.

19 Claims, 7 Drawing Sheets

METHOD OF FORMING SINGLE CRYSTALLINE SILICON LAYER, STRUCTURE INCLUDING THE SAME, AND METHOD OF FABRICATING THIN FILM TRANSISTOR USING THE SAME

This application claims priority to Korean Patent Application No. 10-2005-0078882, filed on Aug. 26, 2005 and all the benefits accruing therefrom under 35 U.S.C. §119, and the contents of which in its entirety are herein incorporated by reference.

BACKGROUND OF THE INVENTION

1. Field of the Invention

The present invention relates to a method of forming a single crystalline silicon layer, a structure including the same, and a method of fabricating a thin film transistor ("TFT") using the same. More particularly, the present invention relates to a method of forming a single crystalline silicon layer with high crystallinity, a structure including the same, and a method of fabricating a TFT using the same.

2. Description of the Related Art

Since poly crystalline silicon ("poly-Si") has higher mobility than amorphous silicon ("a-Si"), poly-Si is applied not only to flat panel displays ("FPDs") but also to various electronic devices, such as solar batteries. However, poly-Si is inferior in mobility and uniformity to single crystalline silicon.

In particular, single crystalline silicon is useful to a system on panel ("SOP") structure in which a system is disposed on a display panel. The single crystalline silicon has a mobility of 300 cm$^2$/Vs or higher. The use of single crystalline silicon with a high mobility is advantageous to formation of a high-quality switching device for a display device.

However, formation of single crystalline silicon is not free from temperature limitations. That is, a process of forming single crystalline silicon cannot be performed at a temperature higher than a temperature which a base substrate, for example, a plastic substrate or a glass substrate, can resist.

A process of forming a silicon-on-insulator ("SOI") wafer, which is called a "smart-cut process," includes a high-temperature annealing process that reaches a temperature of about 1000° C. Specifically, the smart-cut process includes thermally oxidizing a bare wafer with a predetermined thickness, forming a boundary layer by implanting H$^+$ ions beneath the surface of the wafer, bonding the wafer to an additional substrate and separating the boundary layer to leave silicon on the substrate to a predetermined thickness, and performing an annealing process at a high temperature.

In this smart-cut process, the thermal oxidization process is performed at a temperature of 900° C. or higher, and the annealing process is performed at a temperature of up to 1100° C. Thus, there is a strong likelihood that these high-temperature processes inflict great damage on the substrate. Accordingly, the conventional method of forming an SOI wafer places a limitation on materials of the substrate and applies thermal shock even to a selected material of the substrate, thus adversely affecting the performance of a device obtained from silicon.

Another method of directly forming single crystalline silicon on a substrate is disclosed in "Formation of Location-controlled Crystalline Silicon" by Paul Ch. van der Wilt et al, Applied physics letters 72(12), p. 1819, 2001. This method is directed at forming single crystalline silicon on a desired location.

Specifically, as shown in FIG. 1, an insulating layer 2 having a hole 2a with a predetermined pattern is formed on a glass substrate (or a plastic substrate) 1, and a silicon seed layer is formed in the hole 2a. However, according to this conventional method, the surface of a silicon layer 3 is not flattened around the hole 2a. Since the silicon layer 3 has an uneven surface, it is difficult to obtain single crystalline silicon with high crystallinity.

BRIEF SUMMARY OF THE INVENTION

The present invention provides a method of forming a single crystalline silicon layer with high crystallinity, a structure including the same, and a method of fabricating a thin film transistor ("TFT") using the same.

According to exemplary embodiments of the present invention, there is provided a method of forming a single crystalline silicon layer. The method includes forming a silicon nitride layer on a substrate, forming an insulating layer on the silicon nitride layer, forming a hole in the insulating layer to a predetermined dimension, depositing a first silicon layer on an exposed bottom of the hole using a selective deposition process, depositing a second silicon layer on the insulating layer and the first silicon layer formed in the hole, and crystallizing the second silicon layer using a thermal process.

According to other exemplary embodiments of the present invention, there is provided a method of fabricating a single crystalline silicon TFT. The method includes forming a silicon nitride layer on a substrate, forming an insulating layer on the silicon nitride layer, forming a hole in the insulating layer to a predetermined dimension, depositing a first silicon layer on an exposed bottom of the hole using a selective deposition process, depositing a second silicon layer on the insulating layer and the first silicon layer formed in the hole, crystallizing the second silicon layer using a thermal process, and forming a single crystalline silicon TFT on the substrate using the crystallized second silicon layer.

According to other exemplary embodiments of the present invention, there is provided a structure including a single crystalline silicon layer. The structure includes a substrate, a silicon nitride layer formed on the substrate, an insulating layer formed on the silicon nitride layer, a hole formed in the insulating layer, a first silicon layer deposited in the hole, a first surface of the first silicon layer substantially coplanar with a first surface of the insulating layer, and a second silicon layer deposited on the first surface of the insulating layer and the first surface of the first silicon layer formed in the hole, wherein the second silicon layer is crystallized.

The insulating layer may be formed of SiO$_2$, and the first and second silicon layers are sequentially formed.

Also, the substrate may be a plastic substrate or a glass substrate.

BRIEF DESCRIPTION OF THE DRAWINGS

The above and other features and advantages of the present invention will become more apparent by describing exemplary embodiments thereof with reference to the attached drawings in which.

DETAILED DESCRIPTION OF THE INVENTION

Figure 1:
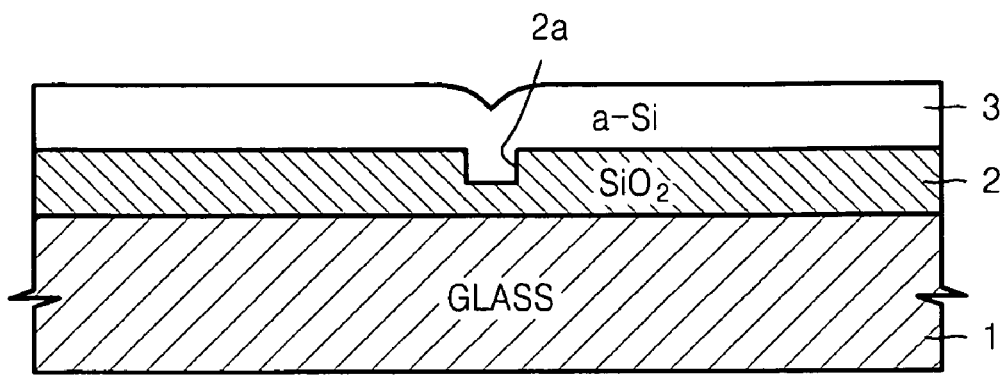
FIG. 1 is a cross sectional view of a stacked structure of a silicon layer formed by a conventional method.

The invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present there between. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

Figure 2A:
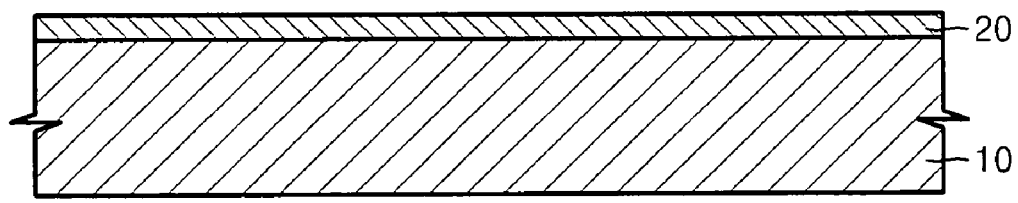
FIGS. 2A through 2F are cross sectional views illustrating an exemplary method of forming an exemplary single crystalline silicon layer according to an exemplary embodiment of the present invention.

Referring to FIG. 2A, a silicon nitride SiN thin layer 20 is formed on a substrate 10 using a chemical vapor deposition ("CVD") process. The substrate 10 may be a glass substrate or a plastic substrate.

Figure 2B:
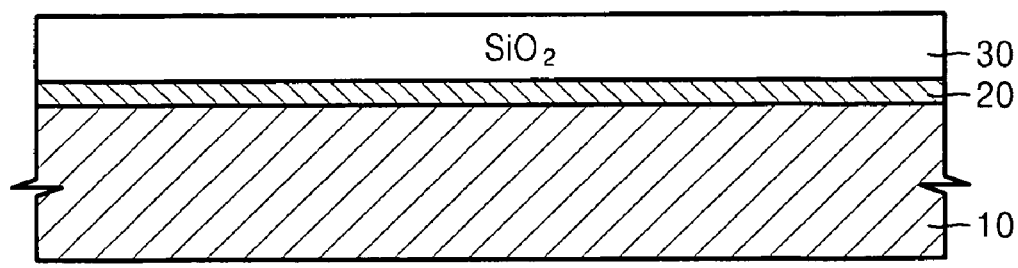

Referring to FIG. 2B, a silicon dioxide $SiO_2$ insulating layer 30 is formed on the SiN thin layer 20. Here, the SiN thin layer 20 exhibits a lower silicon deposition rate than the $SiO_2$ insulating layer 30. The SiN thin layer 20 and the $SiO_2$ insulating layer 30 are formed using a CVD process at a temperature of, for example, about 550° C. or lower, such as 500° C. or lower.

Figure 2C:
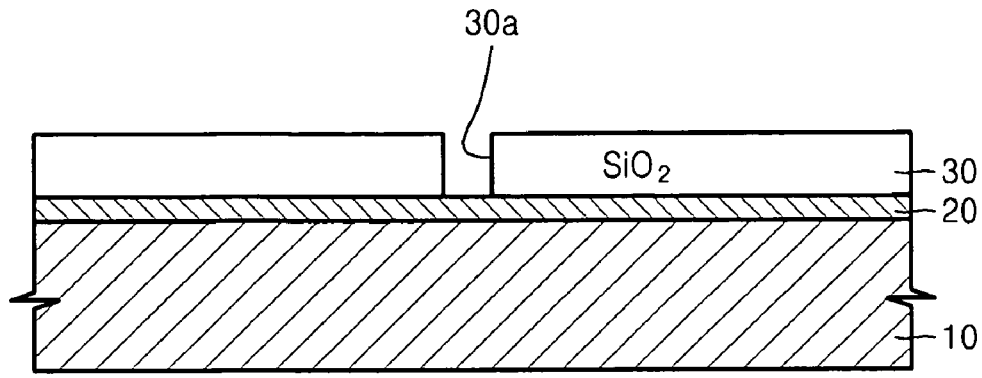

Referring to FIG. 2C, the insulating layer 30 is patterned, thereby forming a hole 30a. Thus, a portion of the SiN thin layer 20 is exposed by the hole 30a. Although a plurality of holes 30a are arrayed in the insulating layer 30, for convenience of illustration, only one hole 30a is illustrated in FIG. 2C.

Figure 2D:
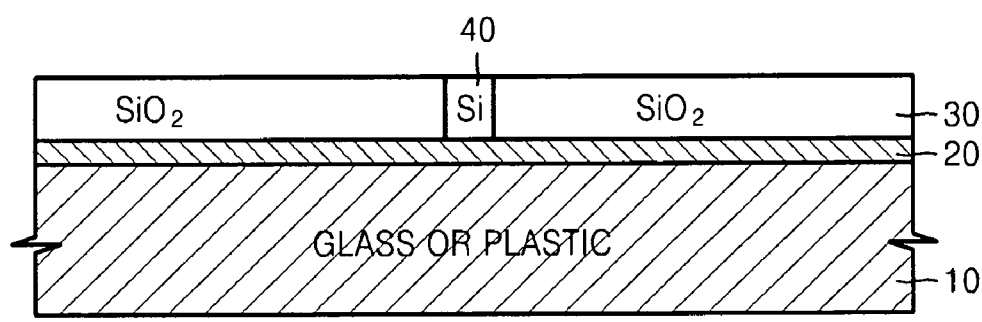

Referring to FIG. 2D, a first silicon layer 40 is formed in the hole 30a using a selective deposition process, such as a high-vacuum CVD ("HVCVD") process or a low-pressure CVD ("LPCVD") process. In this process, the first silicon layer 40 may be formed not only on the exposed portion of the SiN thin layer 20 in the hole 30a but also on the $SiO_2$ insulating layer 30. However, since the first silicon layer 40 is deposited firstly on the exposed portion of the SiN thin layer 20 and then on the $SiO_2$ insulating layer 30 with the lapse of predetermined time, the first silicon layer 40 can be selectively deposited only in the hole 30a by properly controlling a deposition time. The hole 30a may be filled with the first silicon layer 40 such that the $SiO_2$ insulating layer 30 forms a planar surface with the first silicon layer 40. In other words, an upper (first) surface of the insulating layer 30 may be coplanar with an upper (first) surface of the first silicon layer 40 disposed within the hole 30a. To obtain the above-described result, the deposition time of the first silicon layer 40, the thickness of the insulating layer 30, and the diameter of the hole 30a may be properly controlled.

Figure 2E:
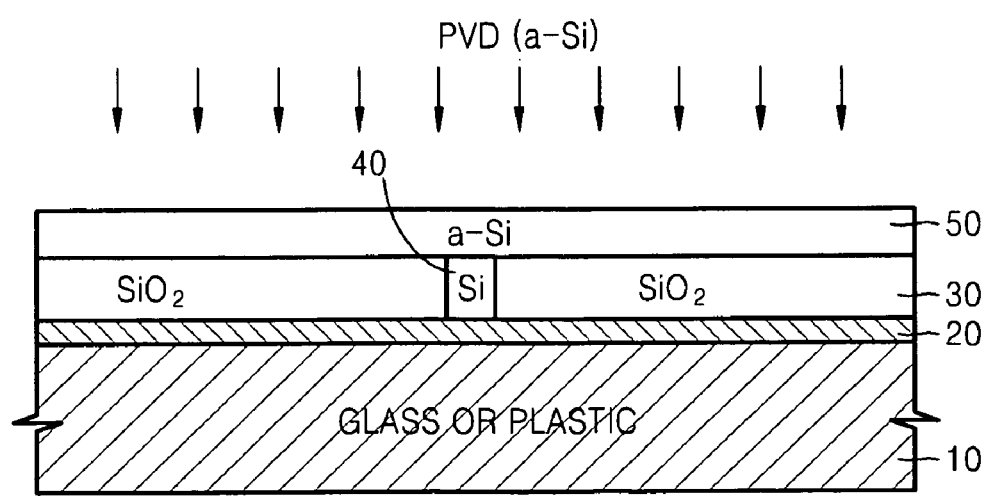

Referring to FIG. 2E, a second silicon layer 50 is formed on the upper surface of the insulating layer 30 and the upper surface of the first silicon layer 40 using a physical vapor deposition ("PVD") process, such as, but not limited to, a sputtering process. The second silicon layer 50 is formed using amorphous silicon ("a-Si") to a thickness of less than 100 nm, such as about 50 nm.

Figure 2F:
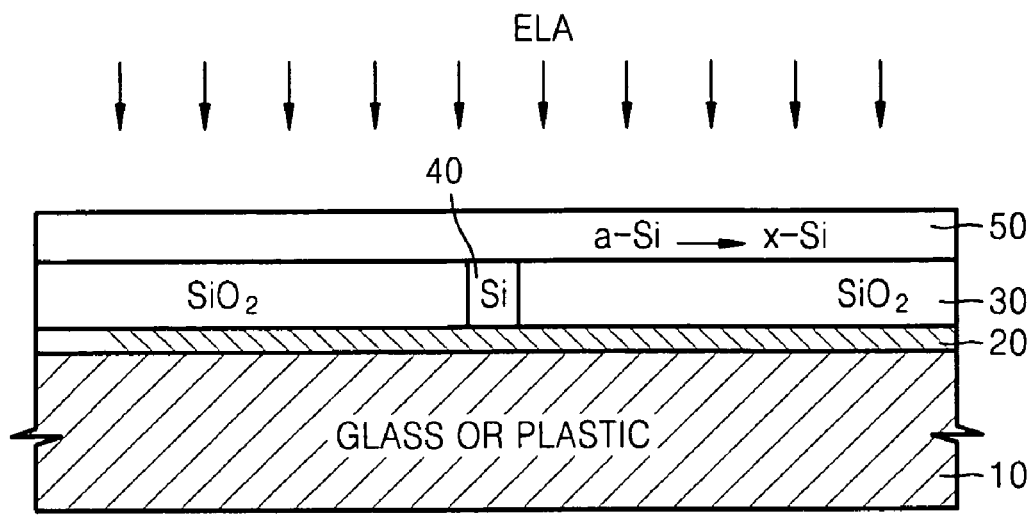

Referring to FIG. 2F, the second silicon layer 50 is thermally treated using an excimer laser annealing ("ELA") process and crystallizes into a single crystalline silicon ("x-Si") layer (hereinafter, reference numeral 50 refers to the x-Si layer). Crystals of the x-Si layer grow from the first silicon layer 40 formed in the hole 30*a* in a radial lateral direction. In this case, single-crystalline-like silicon crystals, not complete x-Si crystals, are obtained. Also, the single-crystalline-like silicon crystals have boundaries that are spaced a predetermined distance apart from the center of the hole 30*a*. Thus, the formation of location-controlled single crystalline silicon is made possible while maintaining a substantially planar surface of the x-Si layer 50.

Thus, according to the above-described method, the x-Si layer 50 with a generally planar surface and high crystallinity can be obtained even when using formation of location-controlled single crystalline silicon. A variety of transistors, that include the above-described x-Si layer 50, can be fabricated using a known technique or other techniques as described herein.

Hereinafter, two different types of exemplary TFTs, which are both formed using the above-described x-Si layer 50, will be briefly described with reference to FIGS. 3A and 3B.

Figure 3A:
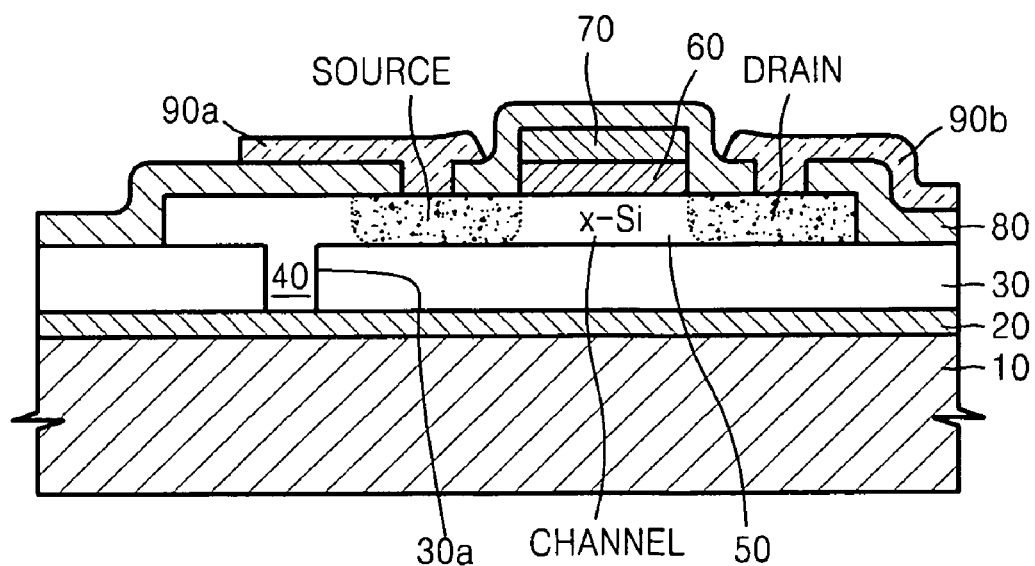
FIGS. 3A and 3B are cross sectional views of exemplary single crystalline silicon thin film transistors ("TFTs") with different structures, which are fabricated according to exemplary embodiments of the present invention.
Figure 3B:
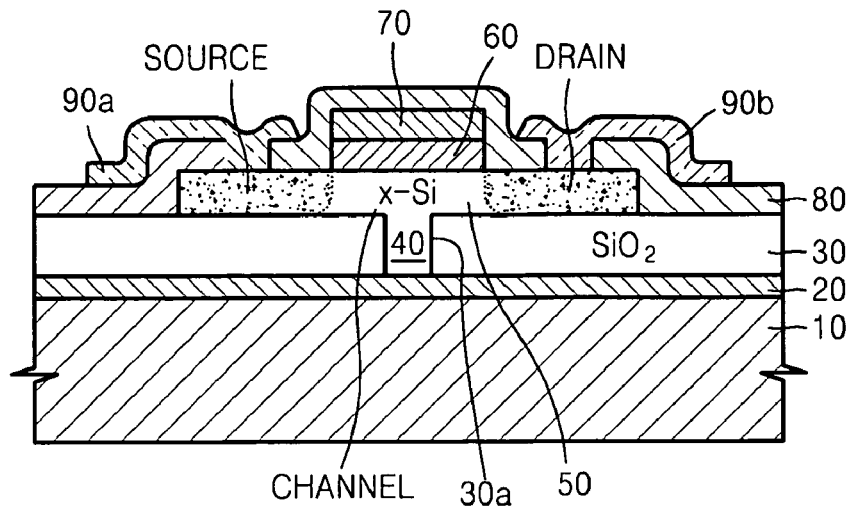

Referring to FIGS. 3A and 3B, an active layer is obtained from the x-Si layer 50 that is formed according to the above-described method. The active layer includes a channel of a transistor and a source and a drain, which are doped on opposing sides of the channel. A gate insulating layer 60 and a gate 70 are formed on the channel, which corresponds to a central portion of the x-Si layer 50. An interlayer dielectric ("ILD") layer 80 covers the gate insulating layer 60 and the gate 70, and may further cover exposed portions of the x-Si layer 50, such as the source and the drain, and exposed portions of the insulating layer 30. Contact holes corresponding to the source and drain of the active layer are disposed in the ILD layer 80, and a source electrode 90*a* and a drain electrode 90*b* overlap the ILD layer 80 and are connected to the source and drain through the contact holes, respectively.

A transistor shown in FIG. 3A differs from a transistor shown in FIG. 3B in terms of the location of the hole 30*a* used for the formation of the first silicon layer 40 in the above-described process. Specifically, the transistor of FIG. 3A employs a portion of the x-Si layer 50, which is not aligned with the hole 30*a* with the highest crystallinity, as the channel. However, the transistor of FIG. 3B employs a portion of the x-Si layer 50, which has the hole 30*a* aligned with the center of the x-Si layer 50, as the channel.

Hereinafter, an exemplary method of fabricating the exemplary TFT shown in FIG. 3A will be described as an example with reference to FIGS. 4A through 4H.

Initially, the singe crystalline silicon layer obtained according to the above-described method, as illustrated in FIGS. 2A-2F, may be optionally polished using a polishing apparatus to have a predetermined thickness and a flattened surface before the x-Si layer 50 is used for the fabrication of the TFT. FIGS. 4A through 4H illustrate an exemplary method of fabricating the exemplary TFT using a portion of the x-Si layer 50 on one side of the hole 30*a* (specifically, on the right side of the hole 30*a* as shown in the drawings). Thus, FIGS. 4A through 4H do not illustrate a portion of the x-Si layer on the left side of the hole 30*a* for clarity of explanation. That is, in the present embodiment, it is exemplarily described that only one transistor is fabricated on one side of the x-Si layer. However, in an alternative embodiment, two transistors may be fabricated using two portions of the x-Si layer disposed on opposite sides of the hole 30*a* according to design specifications.

Figure 4A:
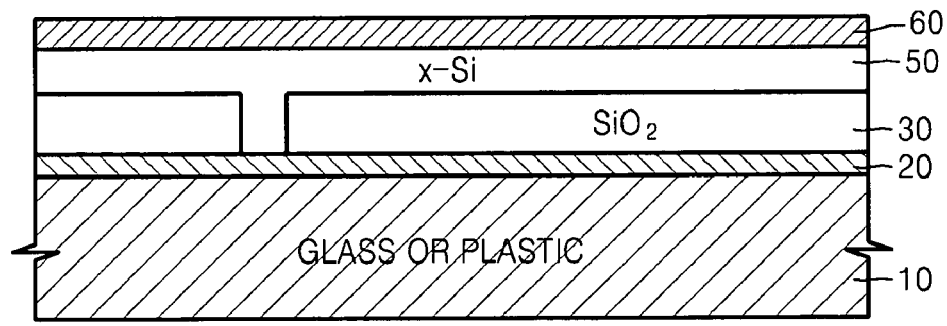
FIGS. 4A through 4H are cross sectional views illustrating an exemplary method of fabricating an exemplary single crystalline silicon TFT according to an exemplary embodiment of the present invention.

Referring to FIG. 4A, in order to fabricate the TFT using the above-described x-Si layer 50 as an active layer, a $SiO_2$ gate insulating layer 60 is formed on the x-Si layer 50. The gate insulating layer 60 is formed to a thickness of about 1000 Å using an inductively coupled plasma CVD ("ICP-CVD") process, a plasma-enhanced CVD ("PECVD") process, or a sputtering process.

The substrate 10 may be, for example, either glass or plastic. When the substrate 10 is a plastic substrate, the substrate 10 may be deformed due to heat during the formation of the $SiO_2$ gate insulating layer 60. Thus, a temperature at which the $SiO_2$ gate insulating layer 60 is annealed should be properly controlled. Accordingly, the TFT should be fabricated at a temperature of 500° C. or lower in order to inhibit deformation of the substrate 10 due to heat.

Figure 4B:
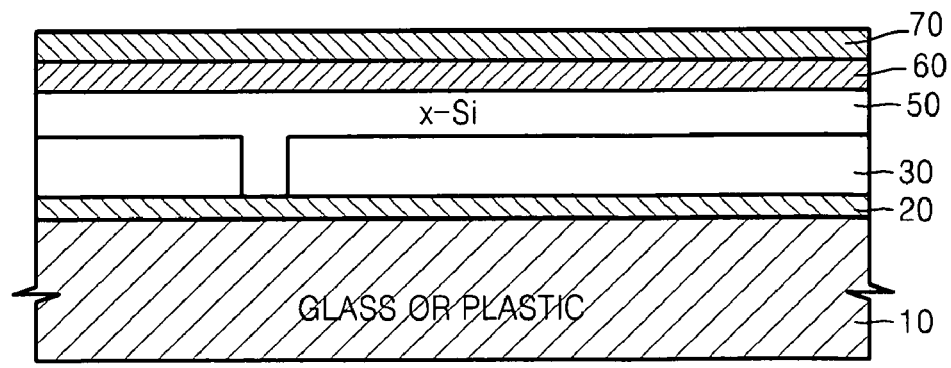

Referring to FIG. 4B, a metal layer, such as, but not limited to, aluminum Al, for forming a gate 70 is formed on the gate insulating layer 60. At this stage of the method, since the gate insulating layer 60 and the gate 70 do not take on shapes appropriate for given functions, the gate insulating layer 60 and the gate 70 must be properly patterned in a subsequent process.

Figure 4C:
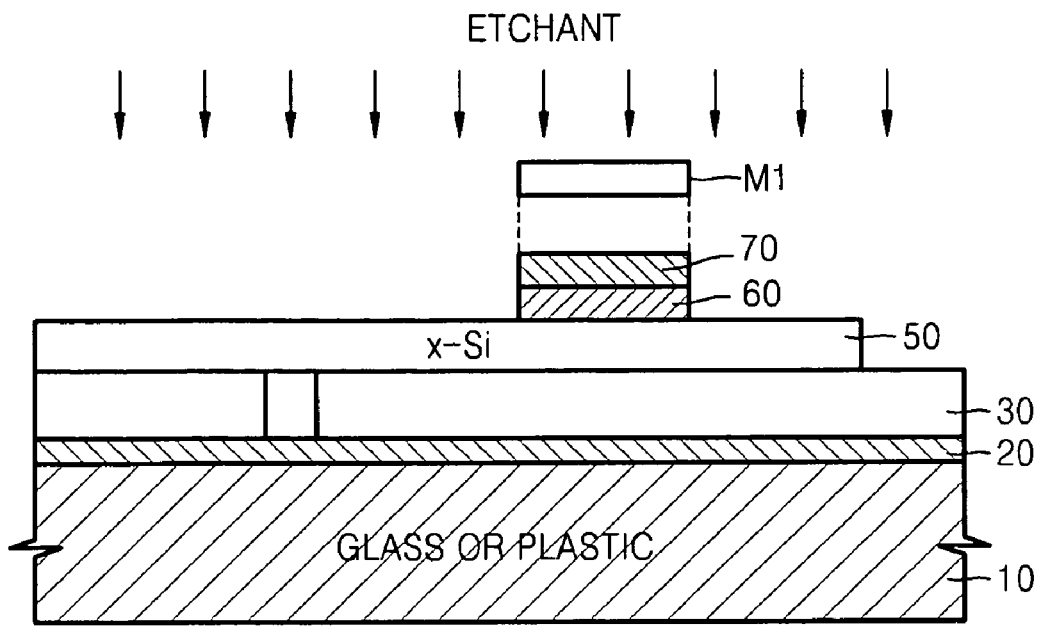

Referring to FIG. 4C, the gate 70 and the gate insulating layer 60 are dry etched using a first mask M1. The first mask M1 has a pattern corresponding to the shape of a desired gate. Thus, the gate 70 and the gate insulating layer 60 are patterned in the same shape as the first mask M1. In this process, a portion of the x-Si layer 50, which is not covered by the gate 70, is exposed.

Figure 4D:
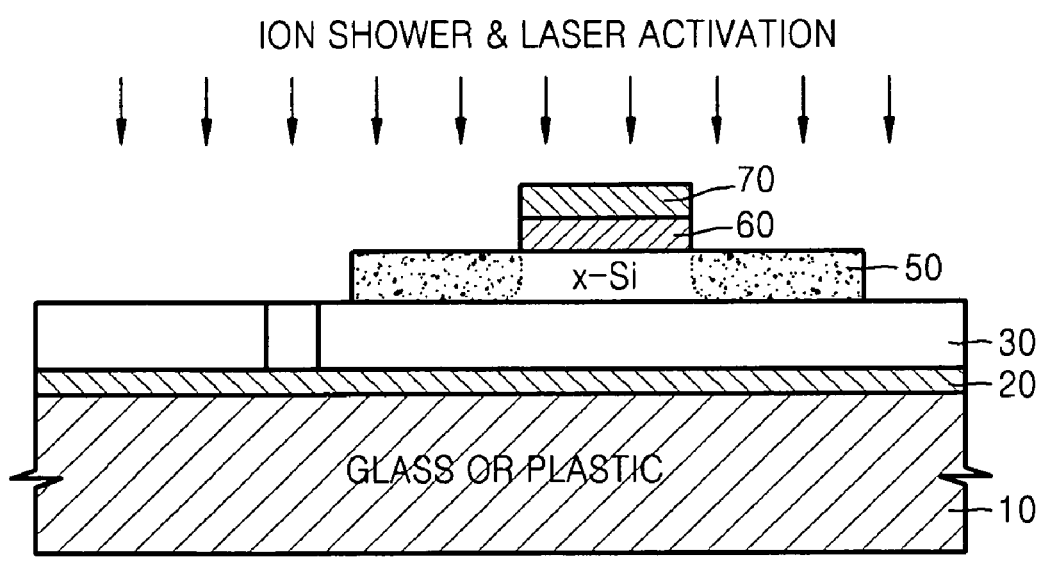

Referring to FIG. 4D, the exposed portion of the x-Si layer 50 is showered with ions and activated using a 308-nm xenon chloride XeCl excimer laser apparatus.

Figure 4E:
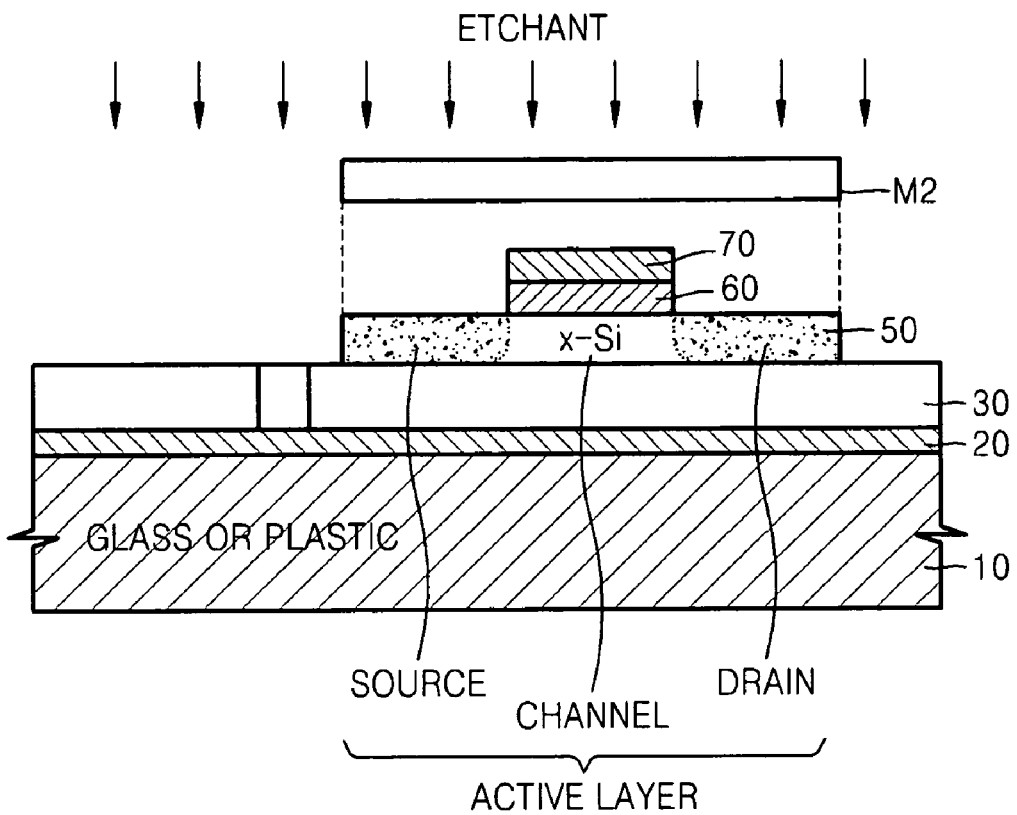

Referring to FIG. 4E, the exposed portion of the x-Si layer 50 is dry etched using a second mask M2, thereby forming a desired active layer. The other portion of the x-Si layer 50, which is covered by the gate 70, remains undoped and will function as a channel of the TFT. Also, portions of the active layer, which are not covered with the gate 70, and which are located on opposite sides of the channel, are doped with conductive ions and become a source and a drain, respectively.

Figure 4F:
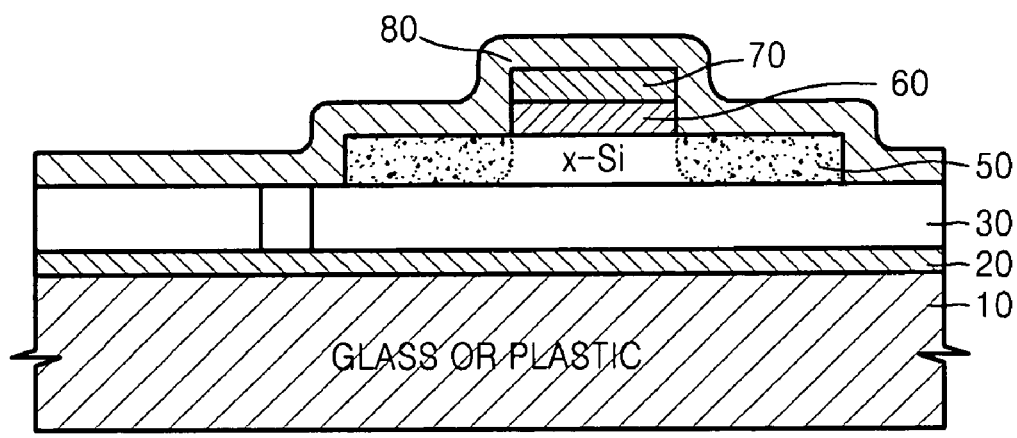

Referring to FIG. 4F, an ILD 80 is formed using $SiO_2$ on the entire surface, or at least substantially the entire surface, of the resultant structure using an ICP-CVD process, a PECVD process, or a sputtering process. The ILD 80 is formed to a thickness of about 3000 Å.

Figure 4G:
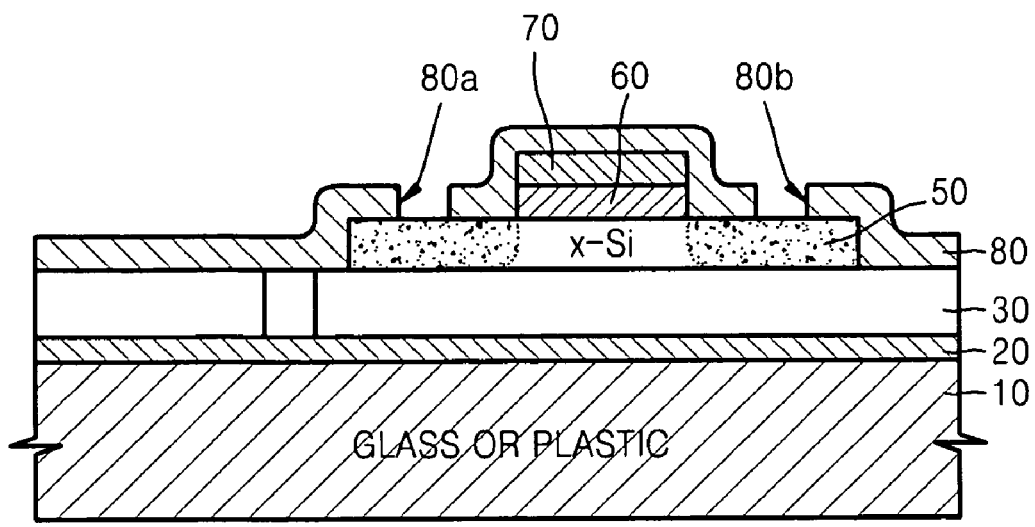

Referring to FIG. 4G, a source contact hole 80*a* and a drain contact hole 80*b* are formed in the $SiO_2$ ILD 80 using a third mask (not shown). The source contact hole 80*a* exposes a portion of the source portion of the x-Si layer 50 and the drain contact hole 80*b* exposes a portion of the drain portion of the x-Si layer 50.

Figure 4H:
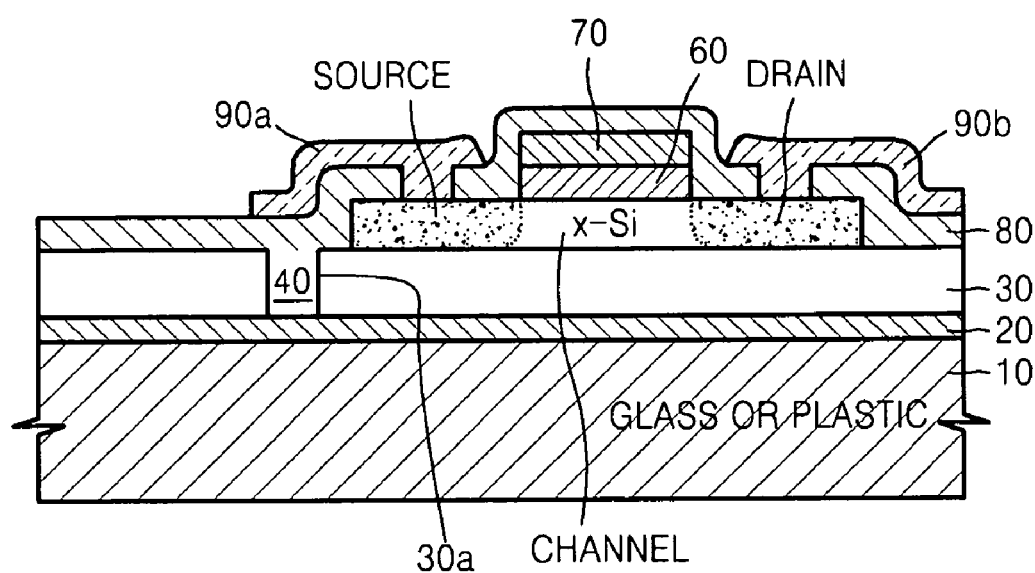

Referring to FIG. 4H, a source electrode 90*a* and a drain electrode 90*b* are formed on the ILD 80 and connect with the source portion of the x-Si layer 50 and the drain portion of the x-Si layer 50 through the source and drain contact holes 80*a* and 80*b*, respectively. As a result, a desired TFT is completed.

The foregoing method of fabricating the TFT is an example of a method of fabricating an exemplary TFT using the x-Si layer formed according to exemplary embodiments of the present invention and can be variously changed.

According to exemplary embodiments of the present invention as described above, a high-quality single crystalline silicon layer can be obtained. In particular, the single crystalline silicon layer can be formed with better surface flatness and crystallinity than in conventional methods. Also, exemplary embodiments of the present invention can be applied to system-on-glass ("SOG") and system-on-plastic ("SOP") semiconductor devices using single crystalline silicon. Therefore, the present invention enables fabrication of high-performance TFTs with excellent reproducibility and limits differences in performance between components.

Furthermore, the exemplary method of fabricating the exemplary single crystalline silicon layer according to the present invention can be applied not only to TFTs but also to other devices using silicon such as, for example, solar batteries.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a single crystalline silicon layer, the method comprising:
   forming a silicon nitride layer on a substrate;
   forming an insulating layer on the silicon nitride layer;
   forming a hole in the insulating layer to a predetermined dimension;
   depositing a first silicon layer on an exposed bottom of the hole using a selective deposition process;
   depositing a second silicon layer on the insulating layer and the first silicon layer formed in the hole; and
   crystallizing the second silicon layer using a thermal process.

2. The method of claim 1, wherein the substrate is one of a plastic substrate and a glass substrate.

3. The method of claim 2, which is performed at a temperature of about 550° C. or lower.

4. The method of claim 1, which is performed at a temperature of about 550° C. or lower.

5. The method of claim 1, wherein depositing a second silicon layer on the insulating layer and the first silicon layer formed in the hole includes forming the second silicon layer of amorphous silicon to a thickness of about 100 nm or less.

6. The method of claim 1, wherein depositing a first silicon layer on an exposed bottom of the hole includes forming the first silicon layer using one of a high-vacuum chemical vapor deposition process and a low-pressure chemical vapor deposition process.

7. The method of claim 1, wherein forming a hole in the insulating layer includes exposing the silicon nitride layer through the hole.

8. The method of claim 1, wherein depositing a first silicon layer on an exposed bottom of the hole includes depositing the first silicon layer to have a top surface substantially coplanar with a top surface of the insulating layer.

9. A method of fabricating a single crystalline silicon thin film transistor, the method comprising:
   forming a silicon nitride layer on a substrate;
   forming an insulating layer on the silicon nitride layer;
   forming a hole in the insulating layer to a predetermined dimension;
   depositing a first silicon layer on an exposed bottom of the hole using a selective deposition process;
   depositing a second silicon layer on the insulating layer and the first silicon layer formed in the hole;
   crystallizing the second silicon layer using a thermal process; and
   forming a single crystalline silicon thin film transistor on the substrate using the crystallized second silicon layer.

10. The method of claim 9, wherein the substrate is one of a plastic substrate and a glass substrate.

11. The method of claim 10, which is performed at a temperature of about 550° C. or lower.

12. The method of claim 9, which is performed at a temperature of about 550° C. or lower.

13. The method of claim 9, wherein depositing a second silicon layer on the insulating layer and the first silicon layer formed in the hole includes forming the second silicon layer of amorphous silicon to a thickness of about 100 nm or less.

14. The method of claim 9, wherein the first silicon layer is formed using one of a high-vacuum chemical vapor deposition process and a low-pressure chemical vapor deposition process.

15. The method of claim 9, wherein depositing a first silicon layer on an exposed bottom of the hole includes depositing the first silicon layer to have a top surface substantially coplanar with a top surface of the insulating layer.

16. The method of claim 9, wherein forming a single crystalline silicon thin film transistor on the substrate using the crystallized second silicon layer includes using the crystallized second silicon layer as an active layer having a channel and doped source and drain regions adjacent the channel.

17. A structure including a single crystalline silicon layer, the structure comprising:
   a substrate;
   a silicon nitride layer formed on the substrate;
   an insulating layer formed on the silicon nitride layer;
   a hole formed in the insulating layer;
   a first silicon layer deposited in the hole, a first surface of the first silicon layer substantially coplanar with a first surface of the insulating layer; and,
   a second silicon layer deposited on the first surface of the insulating layer and the first surface of the first silicon layer formed in the hole, wherein the second silicon layer is crystallized.

18. The structure of claim 17, further comprising a single crystalline silicon thin film transistor formed on the substrate using the second silicon layer as an active layer having a channel and doped source and drain regions adjacent the channel.

19. The structure of claim 17, wherein a first surface of the second silicon layer formed on the first surfaces of the insulating layer and the first silicon layer is substantially planar, and a second surface of the second silicon layer opposite the first surface of the second silicon layer is substantially planar.

* * * * *